(12) United States Patent
Charatan

(10) Patent No.: US 7,427,458 B2
(45) Date of Patent: Sep. 23, 2008

(54) SYSTEM AND METHOD FOR CRITICAL DIMENSION REDUCTION AND PITCH REDUCTION

(75) Inventor: Robert Charatan, Portland, OR (US)

(73) Assignee: Lam Research Corporation, Fremont, CA (US)

( * ) Notice: Subject to any disclaimer, the term of this patent is extended or adjusted under 35 U.S.C. 154(b) by 20 days.

(21) Appl. No.: 11/173,733

(22) Filed: Jun. 30, 2005

(65) Prior Publication Data

US 2007/0004217 A1 Jan. 4, 2007

(51) Int. Cl.
G03F 1/00 (2006.01)
(52) U.S. Cl. .......................................................... 430/5
(58) Field of Classification Search ................. 430/394, 430/5; 716/21
See application file for complete search history.

(56) References Cited

U.S. PATENT DOCUMENTS

| 5,506,080 | A  | * | 4/1996  | Adair et al. | ..................... 430/5 |
| 5,830,607 | A  | * | 11/1998 | Isao et al.  | ..................... 430/5 |
| 6,335,129 | B1 |   | 1/2002  | Asano et al. |        |
| 6,342,428 | B1 | * | 1/2002  | Zheng et al. | ................. 438/424 |
| 6,415,431 | B1 |   | 7/2002  | Neary        |        |
| 6,936,383 | B2 | * | 8/2005  | Mazur et al. | ................... 430/5 |
| 7,056,624 | B2 | * | 6/2006  | Kokubo       | .......................... 430/5 |

\* cited by examiner

Primary Examiner—Stephen Rosasco
(74) Attorney, Agent, or Firm—Martine Penilla & Gencarella, LLP

(57) ABSTRACT

A method of forming a feature includes forming a mask of a first material on an underlying layer, the mask having an incorrect profile. The profile of the mask is corrected and a feature is formed in the underlying layer. A system for forming a feature is also disclosed.

14 Claims, 6 Drawing Sheets

SYSTEM AND METHOD FOR CRITICAL DIMENSION REDUCTION AND PITCH REDUCTION

BACKGROUND OF THE INVENTION

1. Field of the Invention

The present invention relates generally to forming devices in a substrate, and more particularly, to methods and systems for reducing the critical dimension and reducing the pitch in lithographic systems and processes.

2. Description of the Related Art

Reducing the device size (i.e., critical dimension of the devices) and increasing the density of the devices (i.e., pitch reduction) is a constant goal in semiconductor production. These goals aid in reducing the power consumption and cost of the semiconductor device being formed while also increasing the performance of the semiconductor device. Unfortunately, the reduced critical dimension and/or the reduced pitch often require new and expensive equipment to achieve these goals. By way of example, if a photolithographic system is optimized for forming devices having a critical dimension of about 0.4 micron, and a desired critical dimension is about 0.3 micron (an about 25% smaller critical dimension) then the photolithographic system must be replaced and/or extensively modified to accurately achieve the 0.3 micron critical dimension.

Further, more devices having a 0.3 micron critical dimension can be formed in the same area of the substrate (i.e., the pitch can be reduced). By way of example, about 30 devices can be formed in a width of about 24 micron having if each of the devices has a 0.4 micron critical dimension and about 0.4 micron pitch between each device. In comparison, about 40 devices can be formed in the same 24 micron width if each device has a 0.3 micron critical dimension and about 0.3 micron pitch between each device. The photolithographic system optimized for forming devices having the critical dimension of about 0.4 micron pitch must be replaced and/or extensively modified to accurately achieve the 0.3 micron pitch.

As a result, the constant drive for reduced critical dimension and decreased device pitch add to the capital cost of producing semiconductors. In view of the foregoing, there is a need for a system and method for extending the capabilities of a photolithographic process so as to allow reducing the critical dimension and reducing the pitch of the devices.

SUMMARY

Broadly speaking, the present invention fills these needs by providing a system and method for extending the capabilities of a photolithographic process so as to allow reducing the critical dimension and reducing the pitch of the devices. It should be appreciated that the present invention can be implemented in numerous ways, including as a process, an apparatus, a system, computer readable media, or a device. Several inventive embodiments of the present invention are described below.

One embodiment provides a method of forming a feature. The method includes forming a mask of a first material on an underlying layer, the mask having an incorrect profile. Correcting the profile of the mask and forming a feature in the underlying layer. The can also include removing the mask.

Forming the mask on the underlying layer can include forming the mask with a photolithographic process. The photolithographic process is optimized for a first critical dimension and the mask has a second critical dimension that is substantially less than the first critical dimension.

Forming the mask on the underlying layer can include forming the mask with a photolithographic process, the photolithographic process is optimized for a first density and the mask has a second density that is substantially greater than the first density.

Correcting the profile of the mask can include removing a first portion of the sides of the mask. Removing a first portion of the sides of the mask can include at least one of a low pressure etch process or a selective deposition process. The low pressure etch process can include an etch process pressure of less than about 70 milliTorr. The selective deposition process can include a deposition process pressure of greater than about 50 milliTorr.

Correcting the profile of the mask can include adding a second portion material to the sides of the mask. Adding a second portion of material to the sides of the mask can include at least one of a low pressure etch process or a selective deposition process.

The method can also include narrowing the corrected profile of the mask. Narrowing the corrected profile of the mask can include adding a third portion of material to the sides of the mask. The feature formed in the underlying layer can be substantially equal to or less than the narrowed mask.

Another embodiment provides a method of forming a feature. The method includes forming a mask of a first material on an underlying layer. The mask having an incorrect profile and the mask is formed with a photolithographic process. The photolithographic process is optimized for a first critical dimension and the mask has a second critical dimension that is substantially less than the first critical dimension. The profile of the mask is corrected including removing a first portion of the sides of the mask and adding a second portion of material to the sides of the mask. A feature can be formed in the underlying layer. The first portion can be removed from the sides of the mask substantially simultaneously with the second portion of the material being added to the sides of the mask.

Yet another embodiment provides a system for forming devices in a substrate. The system includes a process chamber for enclosing a substrate for processing. The process chamber coupled to a gas manifold and a controller. Multiple process gas sources are fluidly coupled to the gas manifold. The gas manifold coupled to the controller and the controller includes a recipe. The recipe including logic for correcting a profile of a mask formed on the substrate, the mask being formed of a first material.

The logic for correcting the profile of the mask includes logic for removing a first portion of the sides of the mask and logic for adding a second portion of material to the sides of the mask. The recipe can also include logic for narrowing the corrected profile of the mask.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings.

DETAILED DESCRIPTION

Several exemplary embodiments for a system and method for extending the capabilities of a photolithographic process so as to allow reducing the critical dimension and reducing the pitch of the devices will now be described. It will be apparent to those skilled in the art that the present invention may be practiced without some or all of the specific details set forth herein.

The various embodiments described herein provide a system and method for enhancing the performance of existing photolithographic processes and systems. As a result, a photolithographic process and system can be used to form semiconductor devices having smaller critical dimension and increased device density.

Figure 1A:
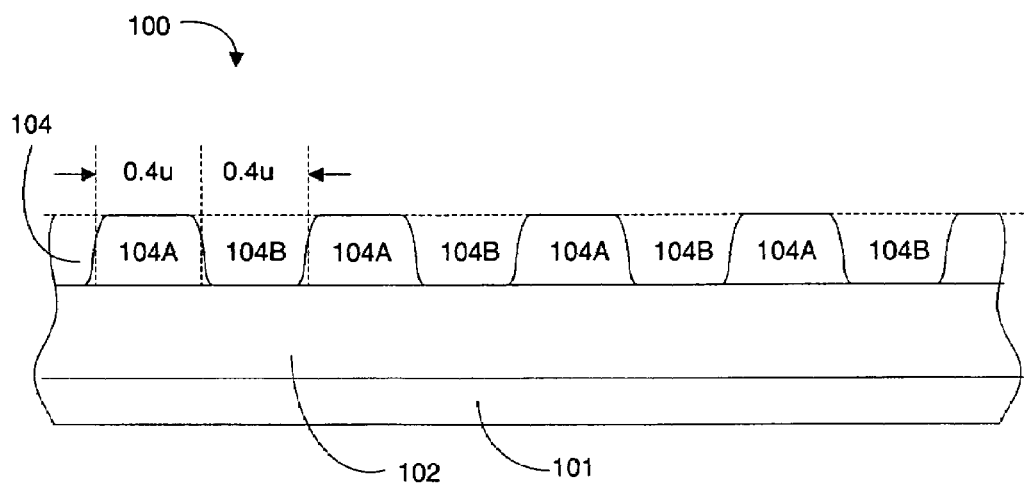
FIG. 1A is a cross-sectional view of a mask formed on a semiconductor substrate, in accordance with one embodiment of the present invention.

FIG. 1A is a cross-sectional view 100 of a mask 104A formed on a semiconductor substrate 102, in accordance with one embodiment of the present invention. The mask 104A is formed using a photolithographic process optimized for forming devices having a critical dimension (i.e., width) of about 0.4 micron or larger features (i.e., a 0.4 micron process). The 0.4 micron process forms openings 104B in the mask material 104. Typically, the 0.4 micron process includes a photolithographic sub process applied to a photoresist mask material 104 (or other photosensitive material). The exposed portions 104A of the mask material 104 are transformed by exposure to the light. The non-exposed portions (not shown) are removed in a subsequent cleaning process to form the openings 104B between the mask 104A.

Each of the removed portions 104B has a width of about 0.4 micron. Each of the removed portions 104B are separated by the mask 104A, that is equal to or larger than about 0.4 micron in width.

The photolithographic process used to form the mask 104A is optimized to form a mask having widths of about 0.4 micron or more in width and a density of about 0.4 micron or more apart. As a result, mask 104A has an optimum profile. The optimum profile mask 104A has sides that are substantially vertical. By way of example, the sides of the mask 104A form an angle θ between about 75 and about 90 degrees to the top surface of the mask layer 104. Further, substantially all of the material in the mask layer 104 has been removed in the openings 104B such that the optimum profile mask 104A have a bottom surface 104C that is substantially parallel to the top surface of the mask layer 104.

Figure 1B:
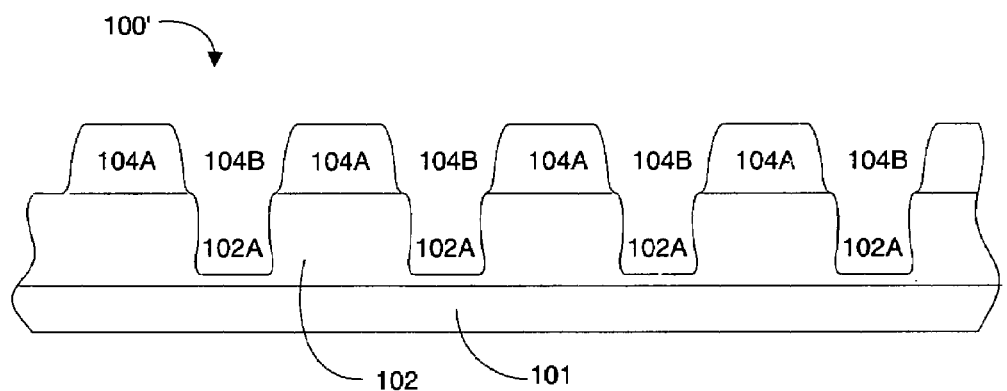
FIG. 1B is a cross-sectional view of features formed using the mask, in accordance with one embodiment of the present invention.

FIG. 1B is a cross-sectional view 100' of features 102A formed using the mask 104A, in accordance with one embodiment of the present invention. The substrate 101 has an intermediate layer 102 formed thereon. The mask 104A is formed on the top surface of the intermediate layer 102 as described above in FIG. 1A. An etching process can be used to form features 102A in the intermediate layer 102.

The shape of the mask 104A helps ensure the shape of the resulting features 102A. By way of example, if the mask 104A has an optimum profile then the resultant features 102A will in many cases, also have an optimum profile of substantially the same width. Similarly, if the mask 104A does not have an optimum profile then the resultant features 102A will more than likely have a less than optimum profile (e.g., less than optimum and/or inconsistent depth and/or width).

Figure 1C:
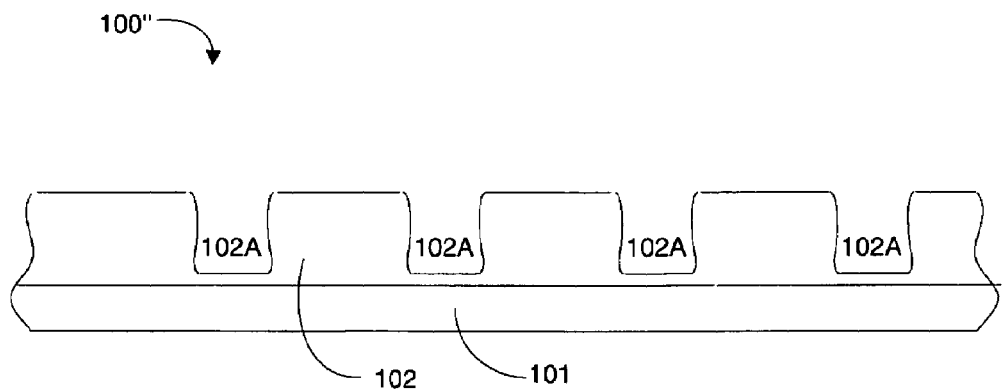
FIG. 1C is a cross-sectional view of features, in accordance with one embodiment of the present invention.

FIG. 1C is a cross-sectional view 100" of features 102A, in accordance with one embodiment of the present invention. After the mask 104A is used to form the features 102A as described above in FIG. 1B, the mask is no longer needed. As shown in FIG. 1C, the mask 104A has been removed. Typically the mask is removed by a chemical mechanical planarization or a selective etching process or any other suitable process to remove the mask 104A. The substrate is then ready for subsequent processing. By way of example the features 102A can be filled with a conductive material (e.g., copper, copper alloy or other conductive materials) to form a conductive trace or a via or other device.

Figure 1D:
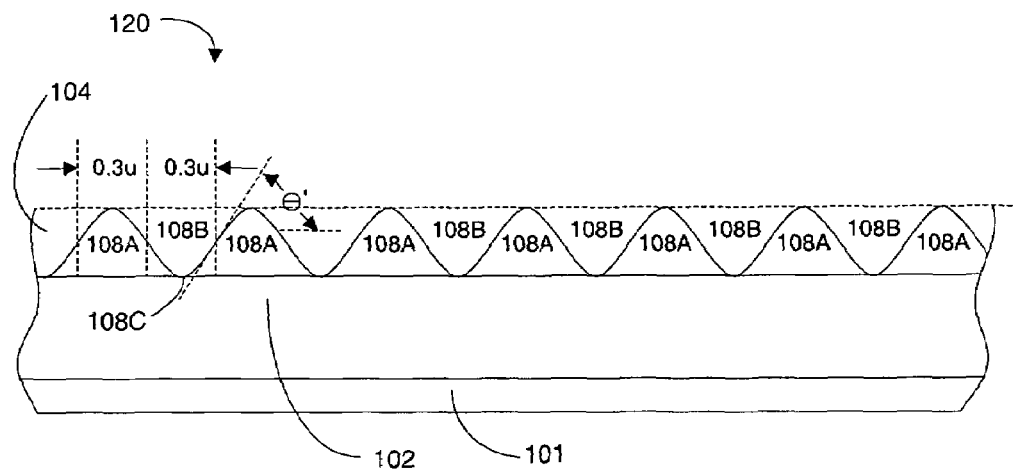
FIG. 1D is a cross-sectional view of 0.3 micron mask formed by the 0.4 micron-optimized photolithographic process, in accordance with one embodiment of the present invention.

As the photolithographic process is optimized to form features 102A having widths of about 0.4 micron or more in width and about 0.4 micron or more apart, then the photolithographic process cannot accurately form features having width or densities less than about 0.4 micron. FIG. 1D is a cross-sectional view of 0.3 micron mask 108A formed by the 0.4 micron-optimized photolithographic process, in accordance with one embodiment of the present invention. FIG. 1F is a detailed view of the profile of a mask 108A, in accordance with one embodiment of the present invention. As the 0.4 micron-optimized photolithographic process is not optimized to produce the mask 108A having widths of about 0.3 micron, the mask 108A does not have an optimum profile. By way of example, the bottom 108C of the openings 108B is rounded or may even be pointed and is not substantially parallel to the top surface of the upper layer 104. Further, the mask 108A has sides that form an angle θ' less than about 75 degrees to the top surface of the mask layer 104.

Figure 1E:
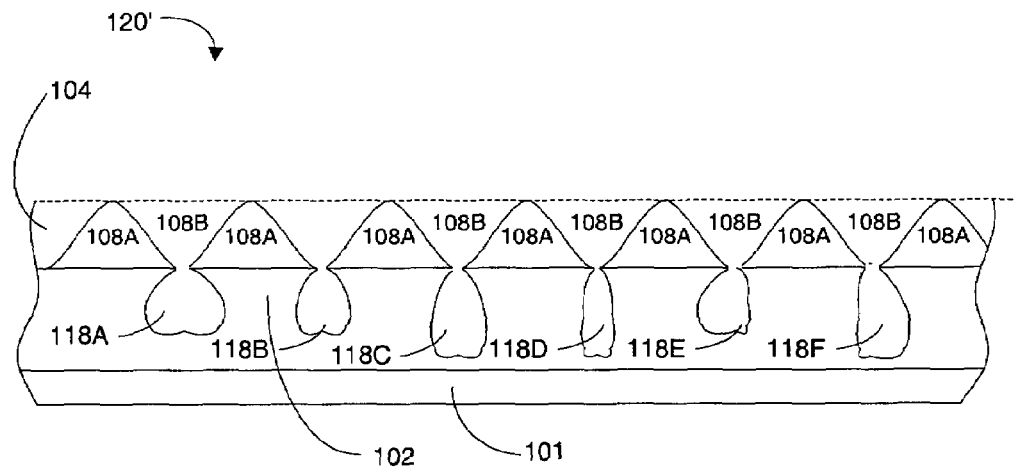
FIG. 1E is a cross-sectional view of the features formed by the 0.3 micron mask, in accordance with one embodiment of the present invention.
Figure 1F:
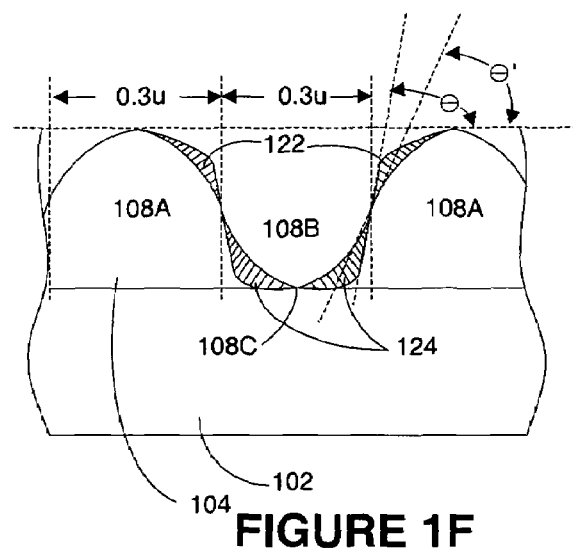
FIG. 1F is a detailed view of the profile of a mask, in accordance with one embodiment of the present invention.

FIG. 1E is a cross-sectional view 120' of the features 118A-F formed by the 0.3 micron mask 108A, in accordance with one embodiment of the present invention. As shown, the features 118A-F formed in the intermediate layer 102 have very inconsistent and unsymmetrical profile, depth and width. Further, the features 118A-F undercut the mask 108A. Further still, the opening to the features 118A-F is too narrow and has inconsistent widths. Once the mask 108A is removed, the inconsistent width of the openings to the features 118A-F will cause inconsistent filling of the features and thus provide poor contact to the underlying layer 101 and/or poor contact to a conductive layer that may be subsequently formed on top of the filled features 118A-F.

In summary the mask 108A has undesirable, excess material 124 remaining at the bottom 108C of the opening 108B. Further, too much material 122 has been removed from the top portion of the mask 108A causing a rounding-off of the top edges of the feature. If the mask 108A were used to attempt to form features (e.g., features 102A) in the intermediate layer 102, the resulting features would not have a predictable and optimum profile as the profile of the mask 108A is not optimum.

One embodiment of the present invention provides a system and method for correcting the profile of the mask 108A to an optimum profile shape. Correcting the profile of the mask 108A can include replacing the material 122 that was removed from the top edge of the mask 108A. Correcting the profile of the mask 108A can also include removing the undesirable excess material 124 remaining at the bottom 108C of the opening 108B.

Figure 2:
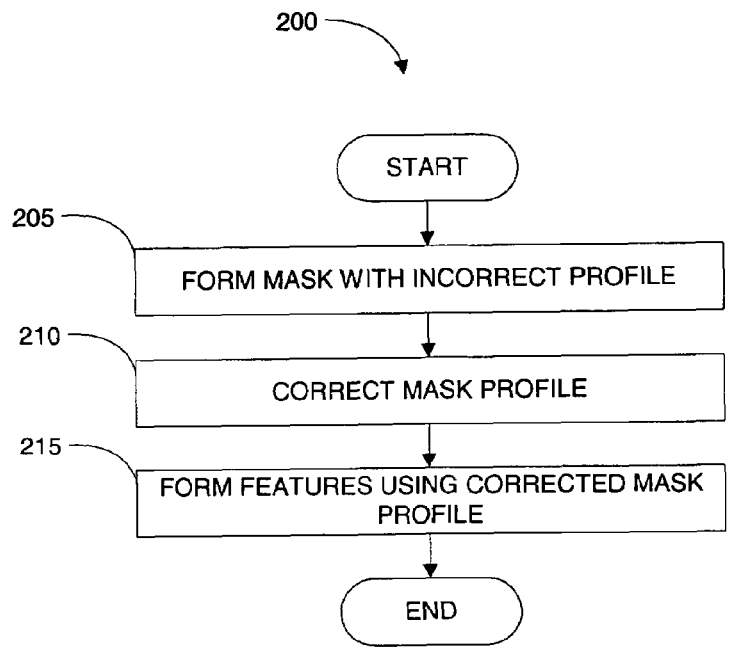
FIG. 2 is a flowchart of the method operations for correcting the profile of the mask, in accordance with one embodiment of the present invention.

FIG. 2 is a flowchart of the method operations 200 for correcting the profile of the mask 108A, in accordance with one embodiment of the present invention. In an operation 205, a mask is formed on an underlying layer. The mask can have an incorrect profile (e.g., mask 108A).

In an operation 210, the profile of the mask 108A is corrected. The profile can be corrected by adding material to the top portion 122 of the mask 108A. Correcting the profile of the mask 108A can also include removing additional material 124 from the bottom portion of the mask 108A. The profile of the mask 108A is corrected until the profile has a desirable profile. By way of example, if the bottom of the mask 108C is sufficiently cleared of material (e.g., similar to bottom 108C of FIG. 1E), however, too much material 122 has been removed from the top portion of the mask 108A, then the only the portions of material 122 may be added to the mask 108A to correct the profile. The profile of the mask 108A can be corrected through gas modulation as will be described in more detail below.

The profile of the mask 108A can be corrected by applying or depositing a material with a non-uniform (e.g., depth dependent) sticking coefficient to the sides of the mask. By way of example, a depositing a material with a non-uniform sticking coefficient material may build up on the top portions 122 of the sides of the mask faster than at the bottom 108C of the sides of the mask and as a result, the non-uniform sticking coefficient material can replace the material 122 at the top portions of the sides of the mask 108A.

Varying plasma conditions can change the amount of material deposited at different locations within the opening 108B of the mask 108A. For example, by increasing the hydrogen to fluorocarbon ratio it is possible to change from a net etching to net depositing plasma. Additional process parameters such as Argon flow and pressure can be employed to control the relative amounts of deposition and etching which occur at profile sidewalls (e.g., material 122) and bottom 108C (e.g., material 124). More generally, to get a directional etch with little or no sidewall deposition, it is beneficial to employ a low pressure (e.g., less than about 70 milliTorr), hydrogen free plasma while a net depositing condition is achievable with a plasma process which utilizes higher pressure and hydrogen flow. One representative example of a recipe which has net etching characteristics is a plasma chamber pressure of about 30 milliTorr, with plasma power of about 800 watts at 27 MHz and 0 watts at 2 MHz, about 180 sccm Argon and about 150 sccm $CF_4$. In comparison, an example of a net depositing recipe is a plasma chamber pressure of about 70 milliTorr, with plasma power of about 800 watts at 27 MHz and 400 watts at 2 MHz, about 240 sccm Argon and about 75 sccm $CF_4$, and about 100 sccm $H_2$. In the context of integrating reducing critical dimension and pitch, the low pressure etch can remove more material (e.g., material 124) from the bottom 108C of the opening 108B in the mask 108A than from the sidewalls of the opening 108B of the mask 108A. Removing the material 124 from the bottom 108C of the opening 108B in the mask 108A corrects at least a portion of the profile of the opening 108B' in the mask. A selective deposition process could be used instead of or in combination with an etch process at a somewhat lower pressure. By way of example, the selective deposition process could be applied at about 70 milliTorr and the etch process be applied at a pressure less than 70 milliTorr (e.g., about 50 milliTorr or between about 20 milliTorr and about 70 milliTorr but less than the pressure of the selective deposition process). The selective deposition process can deposit more or equivalent material on the sidewalls of the opening 108B of the mask 108A (e.g., material 122) than on the bottom 108C of the opening 108B in the mask. (For equivalent, what is meant is that if one etches and removes more material from the bottom than the sidewall and then deposits equivalent amounts of material on the sidewall and bottom, then the net effect is still an etched feature with a reduced opening 108B size.) Adding the additional material 122 to the sidewalls of the opening 108B of the mask 108A not only can iteratively reduce the mask (and as a consequence to be etched feature) dimension, but also can correct the profile of the opening 108B' in the mask 108A. Whether the low pressure etch process and/or the selective deposition process is used is determined by the specific needs of the mask 108A. By way of another example, if the top portion of the profile of the opening 108B of the mask 108A is acceptable, e.g., material 122 is already substantially present), then the selective deposition may be attenuated.

In an operation 215, a feature 302A is formed in the underlying layer (e.g., layer 102) using the mask 108A'having the corrected profile. The corrected profile of the mask 108A' allows the features 302 to be formed with a desirable profile.

Figure 3A:
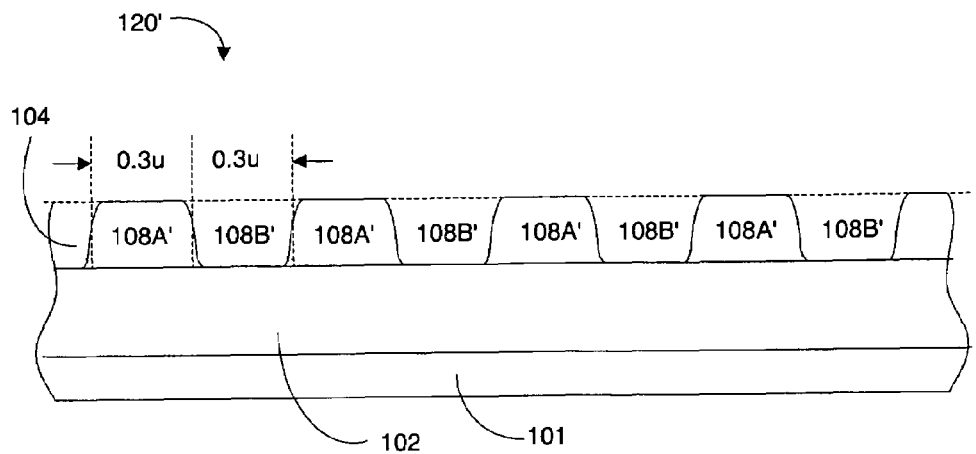
FIGS. 3A and 3B are a cross-sectional view of features formed in the underlying intermediate layer, in accordance with one embodiment of the present invention.
Figure 3B:
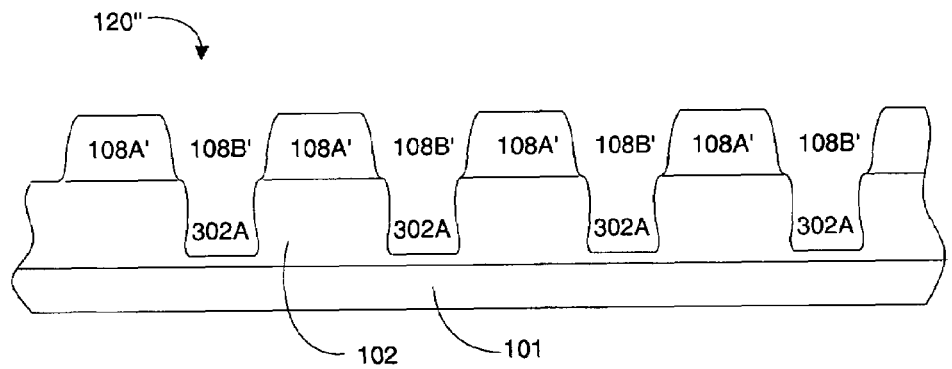

FIGS. 3A and 3B are a cross-sectional view 300 of features 302A formed in the underlying intermediate layer 102, in accordance with one embodiment of the present invention. The 0.3 micron mask 108A was formed using a photolithographic process optimized for 0.4 micron device widths. The 0.3 micron mask 108A had an incorrect profile such as shown in FIGS. 1D-E above. The profile of the opening 108B of the mask 108A was corrected as described above to form mask 108A'. The corrected profile of the opening 108B of the mask 108A' is used to form features 302A in the underlying intermediate layer 102.

As described above in FIGS. 1D-3B, an exemplary 0.4 micron mask has been reduced to form a 0.3 micron mask. It should be understood that similar reduction processes can be employed to reduce other sizes of masks. By way of example a 0.25 micron mask can be reduced to an about 0.15 micron mask. Similarly, a 0.5 micron mask could be reduced to an about 0.4 micron mask.

As described above in FIGS. 1D-3B, a mask can be formed with an incorrect profile such as a mask formed with widths too small for the photolithographic process employed. Then the profile of the opening 108B of the mask 108A can be corrected so that it can be used to form features. (e.g., features 302A) that have similar smaller widths than intended by the photolithographic process employed. The resulting features can also be closer together than intended by the photolithographic process employed.

Figure 5:
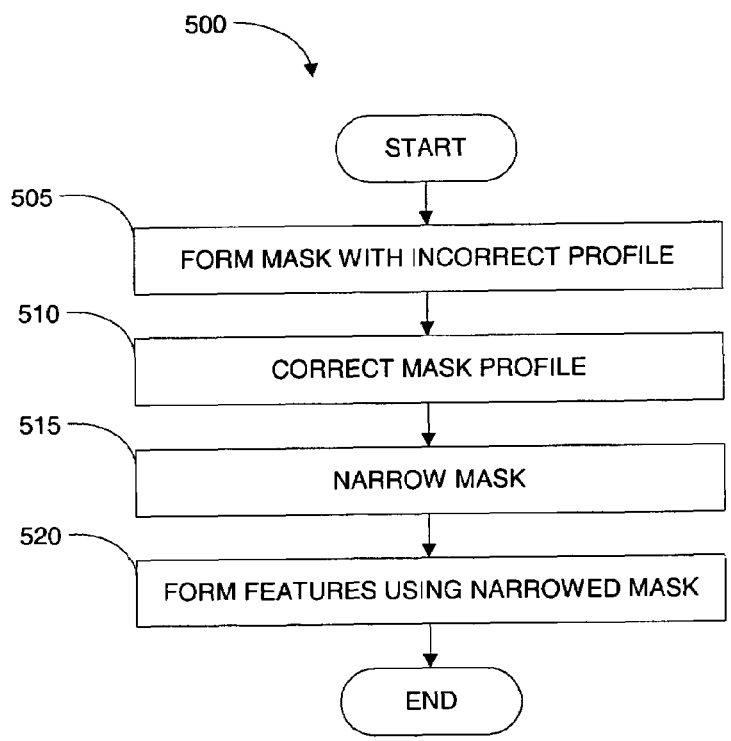
FIG. 5 is flowchart of the method-operations for narrowing a mask, in accordance with one embodiment of the present invention.
Figure 4:
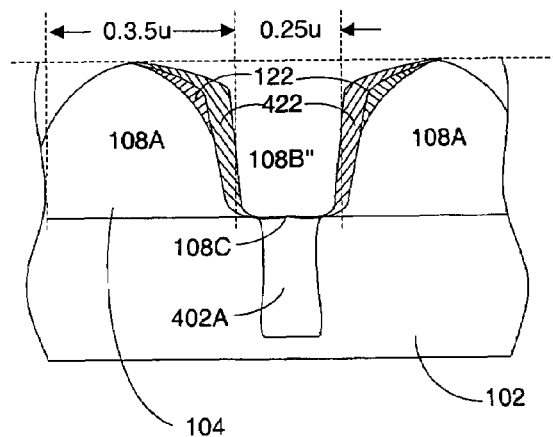
FIG. 4 is a cross-sectional view of features formed in the underlying intermediate layer, in accordance with one embodiment of the present invention.

FIG. 4 is a cross-sectional view 400 of a feature 402A formed in the underlying intermediate layer 102, in accordance with one embodiment of the present invention. FIG. 5 is flowchart of the method-operations 500 for narrowing a mask, in accordance with one embodiment of the present invention. In an operation 505, the mask 108A is formed. In an operation 510, the profile of the opening 108B of the mask 108A is corrected as described above.

In an operation 515, additional material 422 is added to the sides of the opening 108B of the mask 108A to further narrow the opening 108B of the mask 108. By way of example, as described above, a 0.4 micron photolithographic process was used to form a 0.3 micron mask. The profile of the 0.3 micron mask was corrected and then used to form features (e.g., features 302A of FIG. 3B above). The features 302A have substantially the same width as the opening 108B' of the mask 108A' (e.g., about 0.3 micron). As shown in FIG. 4, the additional material 422 can be added to the sidewalls of the opening 108B" of the mask 108A to narrow the opening 108B" in the mask 108A to substantially less than 0.3 micron (e.g., about 0.20 or 0.25 micron width).

The opening 108B" in the mask 108A can be narrowed by gas modulation. The opening 108B" in the mask 108A can be narrowed by adding non-depth dependent, uniform sticking coefficient material to the sides of the opening 108B" of the mask 108A.

As described above, varying plasma conditions can change the amount of material deposited at different locations within the feature. For example, a lower pressure (e.g., less than about 70 milliTorr) etch process, such as described above can be at least somewhat directional in nature. The low pressure etch can remove more material from the bottom 108C of the opening 108B in the mask 108A than from the sidewalls of the opening 108B of the mask 108A. A selective deposition process could be used instead of or in combination with the lower pressure etch process. The selective deposition can be deposit more material on the sidewalls of the opening 108B of the mask 108A than on the bottom 108C of the opening 108B in the mask 108A. Adding the additional material 422 to the sidewalls of the opening 108B of the mask 108A reduces the width of the opening 108B" in the mask 108A.

In an operation 520, the narrowed opening 108B" can be used to form a similarly narrowed feature 402A. By way of example, if the narrowed opening 108B" has a width of about 0.25 micron then the feature 402A can have a width of about 0.2 micron to about 0.25 micron.

Figure 6:
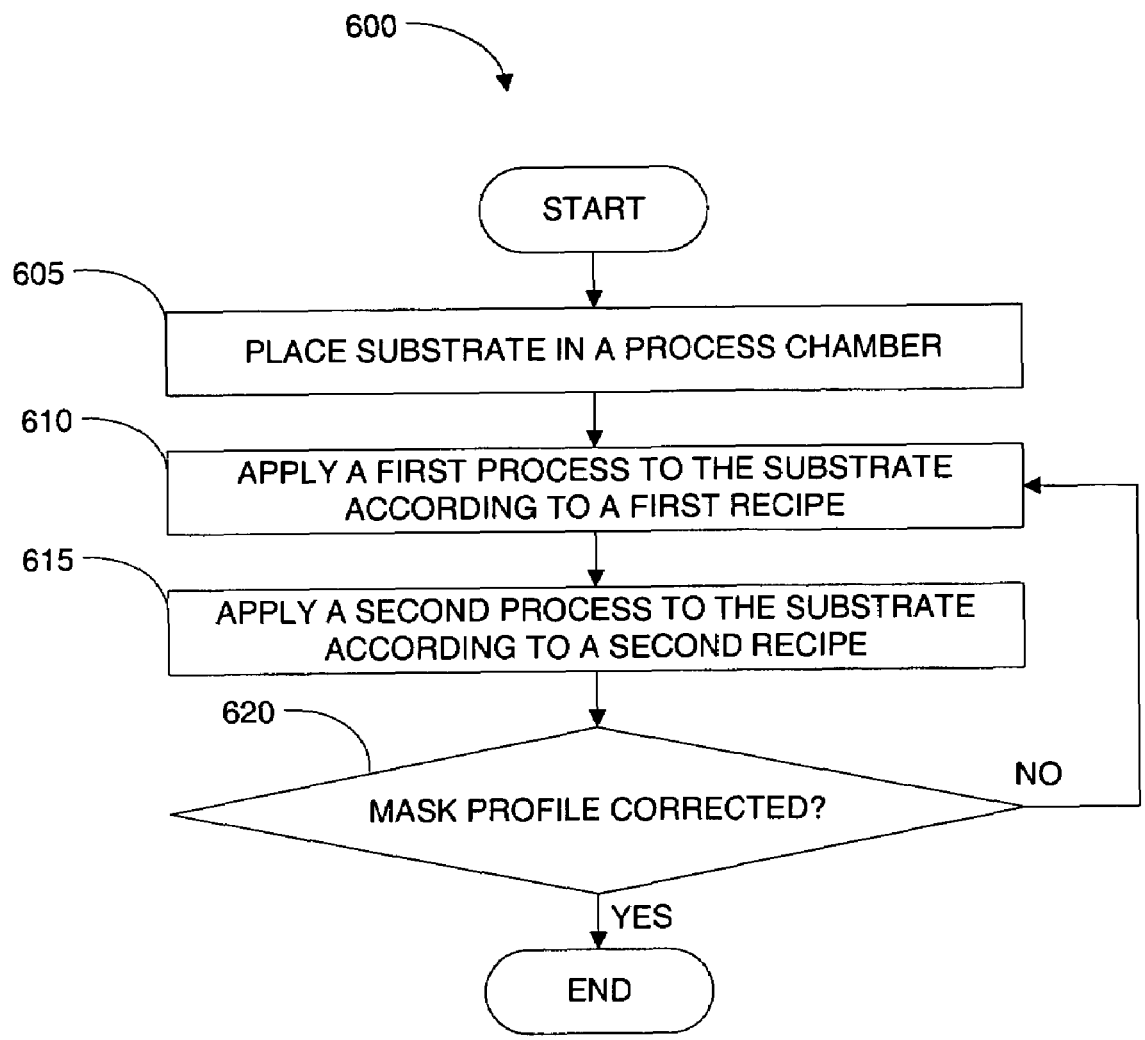
FIG. 6 is flowchart of the method-operations for gas modulation for correcting a profile of a mask, in accordance with one embodiment of the present invention.

FIG. 6 is flowchart of the method-operations 600 for gas modulation for correcting a profile of a mask, in accordance with one embodiment of the present invention. In an operation 605, a substrate 101 is placed in a process chamber. The substrate has an undesirable profile as described in FIGS. 1D-F above. The process chamber can be any suitable process chamber (e.g., a plasma chamber, etch chamber, deposition chamber, etc.).

In an operation 610, a first process is applied to the substrate 101. By way of example and with reference to FIG. 1F above, the first process can remove the excess material 124 from the bottom 108C of the opening 108B in the mask 108A. The excess material 124 can be removed in a selective etch process.

In an operation 615, a second process can be applied to the substrate 101. By way of example and with reference to FIG. 1F above, the second process can add the additional material 122 to the top portion of the opening 108B of the mask 108A. The additional material 122 can be deposited in a deposition process. It should be understood that the operations 610 and 615 can occur in any order and even be iteratively applied to achieve a desired profile.

If, in an operation 620, the profile of the mask 108A is corrected, then the method operations can end. Alternatively, if in operation 620, the profile of the mask 108A is not yet corrected, then the method operations can continue in operation 610. The operations 610 and 615 can also occur substantially simultaneously.

Figure 7:
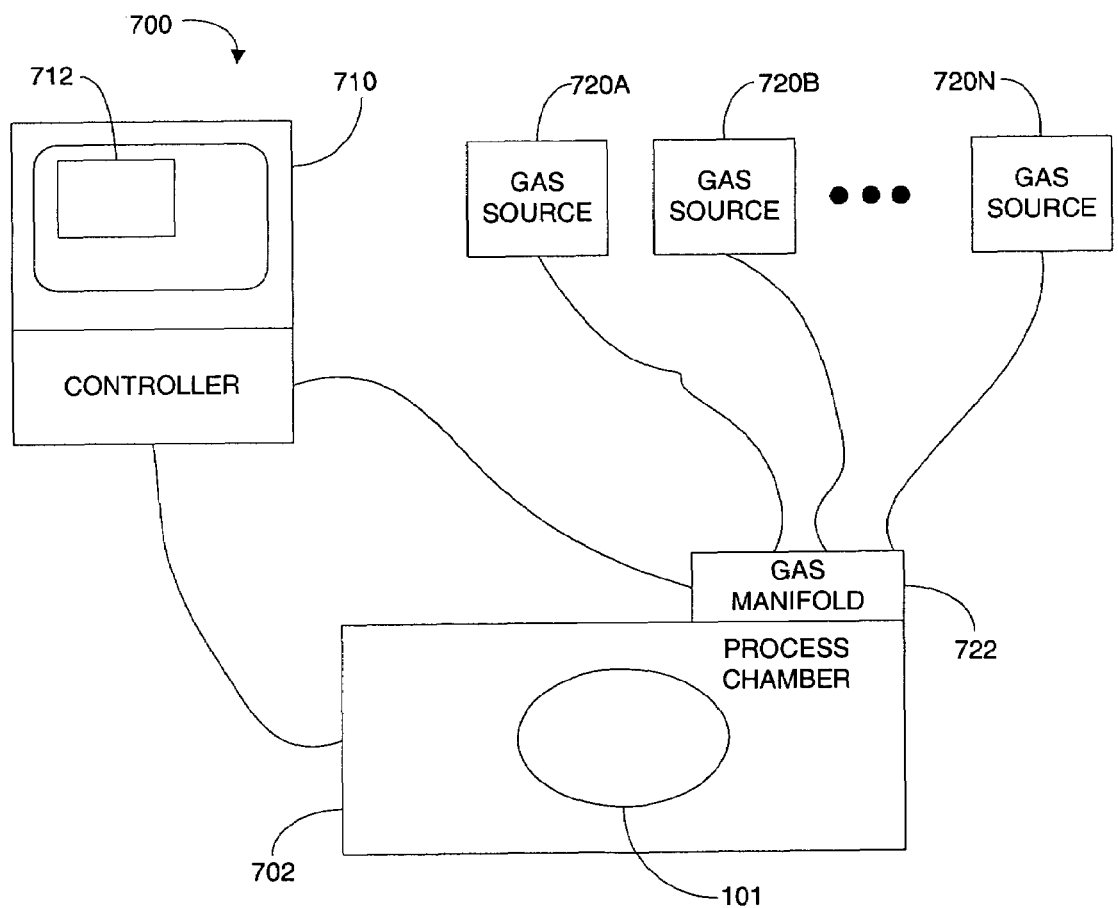
FIG. 7 is a block diagram of a system, in accordance with one embodiment of the present invention.

FIG. 7 is a block diagram of a system 700, in accordance with one embodiment of the present invention. The system includes a process chamber 702 coupled to a controller 710. The controller 710 includes one or more recipes 712 for controlling the processes carried out in the process chamber 702. One or more process gas sources 720A-N are coupled to the process chamber 702 through a gas manifold 722. The gas manifold 722 is coupled to the controller 710. The gas manifold 722 allows the controller 710 to control the pressure, flowrate, mixture and concentration of the process gases from the process gas sources 720A-N in the processing chamber 702.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general-purpose computer selectively activated or configured by a computer program stored in the computer. In particular, various general-purpose machines may be used with computer programs written in accordance with the teachings herein, or it may be more convenient to construct a more specialized apparatus to perform the required operations.

The invention can also be embodied as computer readable code on a computer readable medium. The computer readable medium is any data storage device that can store data which can thereafter be read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer systems so that the computer readable code is stored and executed in a distributed fashion.

It will be further appreciated that the instructions represented by the operations in the above figures are not required to be performed in the order illustrated, and that all the processing represented by the operations may not be necessary to practice the invention. Further, the processes described in any of the above figures can also be implemented in software stored in any one of or combinations of the RAM, the ROM, or the hard disk drive.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method of forming a feature comprising:

receiving a semiconductor substrate having a first layer;

forming a mask of a first material on the first layer, wherein forming the mask includes forming a mask layer on the first layer and forming at least one opening in the mask layer, the at least one opening in the mask layer having an incorrect profile of at least one side of the opening or a bottom of the opening;

correcting the profile of the at least one side of the opening or a bottom of the opening in the mask layer including at least one of:

removing a bottom portion of at least one side of the at least one opening in the mask layer such that the at least one side is substantially perpendicular to top surface of the mask layer; or adding a second portion material to at least one side of the opening in the mask layer such that the at least one side of the opening is substantial perpendicular to a top surface of the mask layer; and forming a feature in the first layer.

2. The method of claim 1, further comprising removing the mask layer from the first layer.

3. The method of claim 1, wherein forming the at least one opening in the mask layer includes forming the at least one opening in the mask layer with a photolithographic process wherein the photolithographic process is optimized for a first critical dimension and wherein the at least one opening in the mask layer has a second critical dimension that is substantially less than the first critical dimension.

4. The method of claim 1, wherein forming the at least one opening in the mask layer includes forming the at least one opening in the mask layer with a photolithographic process wherein the photolithographic process is optimized for a first density of openings and wherein the mask layer has a second density of openings that is substantially greater than the first density of openings.

5. The method of claim 1, wherein removing the bottom portion of the at least one side of the opening in the mask layer includes at least one of a low pressure etch process or a selective deposition process.

6. The method of claim 5, wherein the low pressure etch process includes an etch process pressure of less than about 70 milliTorr.

7. The method of claim 5, wherein the selective deposition process includes an deposition process system pressure of greater than about 50 milliTorr.

8. The method of claim 1, wherein adding a second portion of material to the at least one side of the opening in the mask layer includes at least one of a low pressure etch process or a selective deposition process.

9. The method of claim 1, further comprising narrowing the corrected profile of the opening in the mask layer.

10. The method of claim 9, wherein narrowing the corrected profile of the opening in the mask layer includes adding a third portion of material to the at least one side of the opening in the mask layer.

11. The method of claim 9, wherein the feature formed in the first layer is substantially equal to or less than the narrowed opening in the mask layer.

12. The method of claim 1, wherein correcting the profile of the at least one opening in the mask layer includes removing a bottom portion of at least one side of the at least one opening in the mask layer such that the bottom of the opening is substantially parallel to the top surface of the mask layer and that the bottom of opening has a desired width.

13. A method of forming a feature comprising:

receiving a substrate having a first layer;

forming a mask of a first material on the first layer, wherein forming the mask includes forming a mask layer on the first layer and forming at least one opening in the mask layer, the at least one opening in the mask layer having an incorrect profile of at least one side of the opening or a bottom of the opening, wherein the at least one opening in the mask layer is formed with a photolithographic process, the photolithographic process is optimized for a first critical dimension and wherein the at least one opening in the mask layer has a second critical dimension that is substantially less than the first critical dimension;

correcting the profile of the at least one side of the opening or a bottom of the opening in the mask layer including:

removing a first portion of at least one side of the opening in the mask layer such that the at least one side is substantially perpendicular to top surface of the mask layer; and adding a second portion of material to at least one side of the opening in the mask layer such that the at least one side is substantially perpendicular to top surface of the mask layer; and forming a feature in the first layer.

14. The method of claim 13, wherein the first portion is removed from the at least one side of the opening in the mask layer substantially simultaneously when the second portion of the material is added to the at least one side of the opening in the mask layer.

* * * * *